United States Patent
Liao et al.

(10) Patent No.: US 10,083,860 B2
(45) Date of Patent: Sep. 25, 2018

(54) SEMICONDUCTOR STRUCTURE WITH RESIST PROTECTIVE OXIDE ON ISOLATION STRUCTURE AND METHOD OF MANUFACTURING THE SAME

(71) Applicant: TAIWAN SEMICONDUCTOR MANUFACTURING CO., LTD., Hsinchu (TW)

(72) Inventors: Chen-Liang Liao, Taichung (TW); Chia-Yao Liang, Tainan (TW); Jui-Long Chen, Taichung (TW); Sheng-Yuan Lin, Hsinchu (TW); Yi-Lii Huang, Zhubei (TW); Kuo-Hsi Lee, Taichung (TW); Po-An Chen, Taichung (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/495,901

(22) Filed: Apr. 24, 2017

(65) Prior Publication Data
US 2017/0229343 A1 Aug. 10, 2017

Related U.S. Application Data

(62) Division of application No. 14/795,751, filed on Jul. 9, 2015, now Pat. No. 9,633,860.

(51) Int. Cl.
*H01L 29/06* (2006.01)
*H01L 21/768* (2006.01)
*H01L 21/3205* (2006.01)
*H01L 21/3213* (2006.01)
*H01L 29/49* (2006.01)

(52) U.S. Cl.
CPC .. *H01L 21/76834* (2013.01); *H01L 21/32053* (2013.01); *H01L 21/32134* (2013.01); *H01L 21/32135* (2013.01); *H01L 21/32139* (2013.01); *H01L 29/4933* (2013.01)

(58) Field of Classification Search
CPC ......... H01L 21/32055; H01L 21/32134; H01L 21/32135; H01L 21/32139; H01L 29/0649; H01L 29/42364
USPC ....................................................... 257/622
See application file for complete search history.

(56) References Cited

U.S. PATENT DOCUMENTS

| | | | |
|---|---|---|---|
| 8,551,843 B1 | 10/2013 | Cai et al. | |
| 9,508,845 B1 * | 11/2016 | Lin | .............. H01L 29/0619 |
| 2009/0246922 A1 | 10/2009 | Wu et al. | |
| 2011/0049637 A1 | 3/2011 | Wiatr et al. | |
| 2016/0064286 A1 | 3/2016 | Dilliway et al. | |

(Continued)

*Primary Examiner* — Long K Tran
(74) *Attorney, Agent, or Firm* — Maschoff Brennan (57) ABSTRACT

A method of forming a semiconductor structure includes; (i) forming an isolation structure in a semiconductor substrate, the isolation structure electrically isolating device regions of the semiconductor substrate; (ii) forming a gate structure extending from one of the device regions to the isolation structure; (iii) forming a resist protective oxide layer overlaying the gate structure and the isolation structure; and (iv) patterning the resist protective oxide layer to form a patterned resist protective oxide that covers at least a portion of the isolation structure and a portion of the gate structure on the isolation structure.

20 Claims, 10 Drawing Sheets

(56) References Cited

U.S. PATENT DOCUMENTS

2016/0204229 A1 7/2016 Tsai et al.
2016/0300918 A1* 10/2016 Fang ................ H01L 29/41758

* cited by examiner

SEMICONDUCTOR STRUCTURE WITH RESIST PROTECTIVE OXIDE ON ISOLATION STRUCTURE AND METHOD OF MANUFACTURING THE SAME

RELATED APPLICATIONS

The present application is a divisional of U.S. application Ser. No. 14/795,751, filed on Jul. 9, 2015. The entire disclosures of the above application are hereby incorporated by reference herein.

BACKGROUND

Modern integrated circuits are made up of thousands to millions of active devices such as transistors and passive devices such as capacitors and/or inductances. Technological advances in IC techniques and designs have produced generations of ICs, and each generation has smaller and more complex circuits than the previous generation. These devices are initially isolated from each other, but are later interconnected together through multiple metal layers and via contacts to form functional circuits. As the IC becomes increasingly more complex, the density of active and passive devices in modern integrated circuits is significantly increased, and therefore it is required to decrease the dimension of these devices. Currently, the semiconductor industry has progressed into nanometer technology nodes for higher device density and better electrical performance. However, as device scaling down continues, conventional techniques have not been entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

In the manufacture of integrated circuit devices, silicidation processes are often used to increase the conductivity of silicon. In silicidation, a metal layer is deposited on silicon surfaces and then annealed. The underlying silicon reacts with the metal layer to produce a silicide layer. The silicided regions have lower resistance than non-silicided regions, and hence improve circuit performance. It is desired to perform silicidation on a portion of a wafer whereas another portion of the wafer is protected from silicidation. A patterned resist protective oxide (RPO) layer is often deposited over the wafer where silicidation is undesired. The patterned RPO layer is formed by selectively removing the deposited RPO layer through dry and/or wet etching processes.

However, while the feature sizes continuously shrink, the IC layouts may be modified to meet the needs of modern integrated circuits, and convention manufacturing techniques have not been entirely satisfactory to the modern integrated circuits. For example, the product yield and reliability are unfavorably decreased because some features are damaged after the formation of the patterned RPO layer.

Accordingly, the present disclosure relates generally to a semiconductor structure and a method of manufacturing the semiconductor structure. The semiconductor structure and the method disclosed herein improve product yield and reliability according to various embodiments of the present disclosure. Various embodiments of the present disclosure will be described in detail hereinafter.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the embodiments. As used herein, the term "and/or" includes any and all combinations of one or more of the associated listed items.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Figure 1:
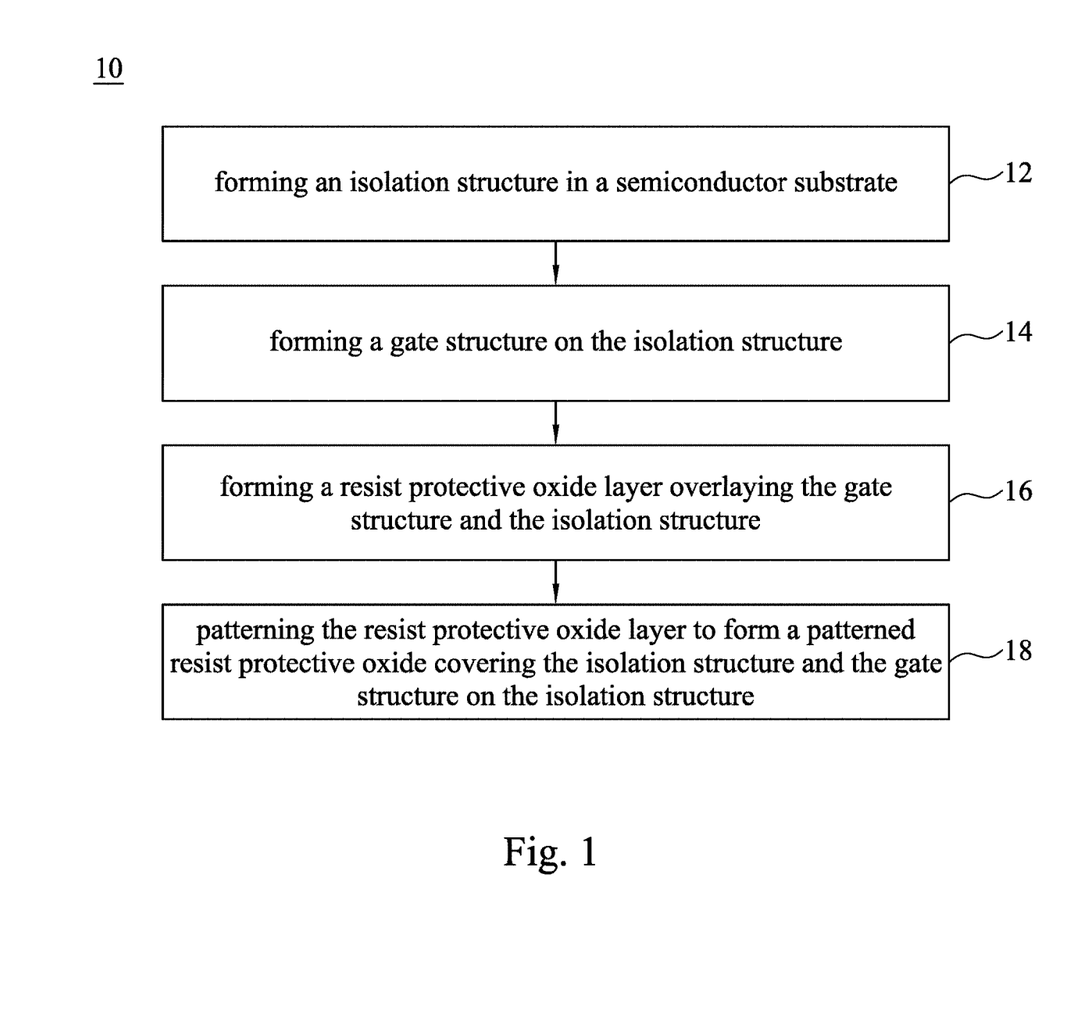
FIG. 1 is a flow chart illustrating a method of forming a semiconductor structure according to various embodiments of the present disclosure.
Figure 2:
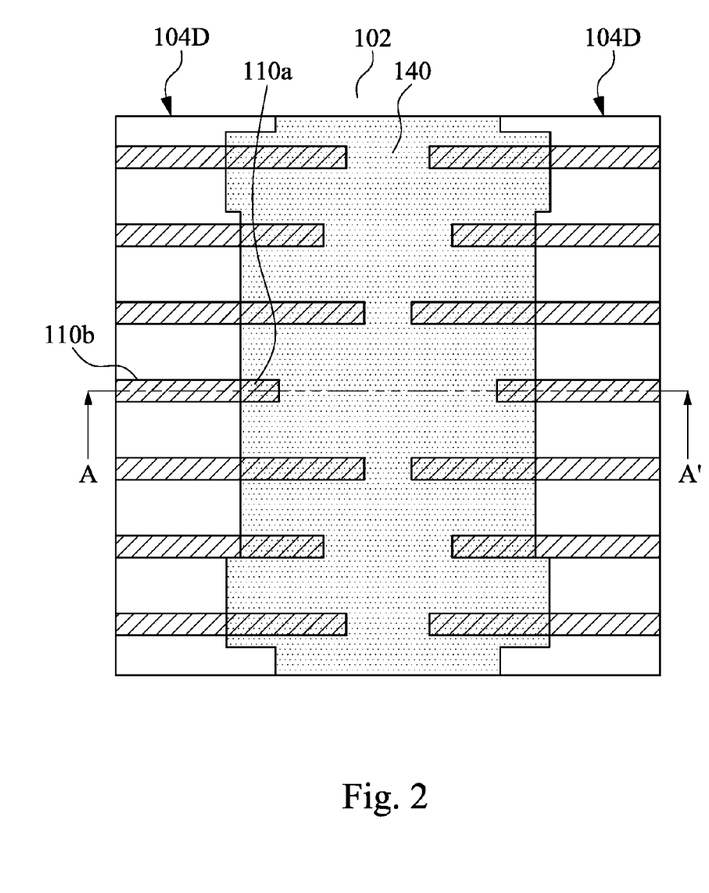
FIG. 2 is a top view schematically illustrating a semiconductor structure according to various embodiments of the present disclosure.

FIG. 1 is a flow chart illustrating a method 10 of forming a semiconductor structure according to various embodiments of the present disclosure. The method 10 includes operation 12, operation 14, operation 16 and operation 18. FIG. 2 is a top view schematically illustrating a semiconductor structure 100 fabricated by the method 10 according to some embodiments of the present disclosure. FIGS. 3-7 collectively illustrate more detailed manufacturing methods as a series of cross-sectional views along line A-A' in FIG. 2 in accordance with some embodiments of the present disclosure. It will be appreciated that although these embodiments each illustrate a number of operations, acts and/or features, not all of these operations, acts and/or features are necessarily required, and other un-illustrated operations, acts and/or features may also be present. Also, the ordering of the operations and/or acts in some nembodiments can vary from what is illustrated in these figures. In addition, the illustrated acts can be further divided into sub-acts in some implementations, while in other implementations some of the illustrated acts can be carried out concurrently with one another.

Figure 3:
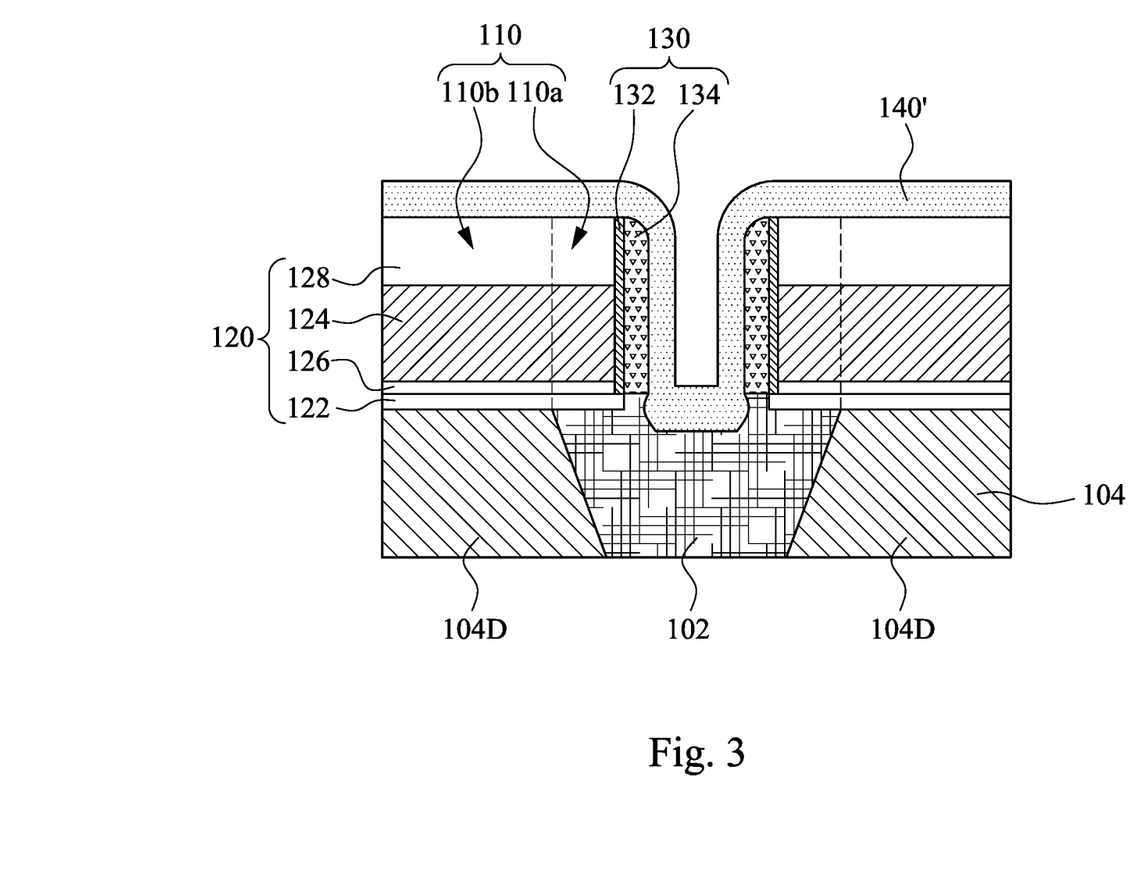
FIGS. 3-7 are cross-sectional views schematically illustrating a method of forming a semiconductor structure in various process stages according to various embodiment of the present disclosure.

In operation 12 of FIG. 1, an isolation structure 102 is formed in a semiconductor substrate 104, as illustrated in FIG. 2 and FIG. 3. The semiconductor substrate 104 includes a plurality of device regions 104D on which active device such as for example N-type metal-oxide semiconductor (NMOS), P-type metal-oxide semiconductor (PMOS) and/or complementary metal-oxide semiconductor (CMOS) devices are to be formed in the subsequent processes. The isolation structure 102 electrically isolates two adjacent ones of the device regions 104D of the semiconductor substrate 104. Accordingly, the area of the isolation structure 102 defines an isolation region of the semiconductor substrate 104. The semiconductor substrate 104 may include, for example, bulk silicon, doped or undoped, or an active layer of a semiconductor-on-insulator (SOI) substrate. Other substrates such as a multi-layered or gradient substrate may also be used.

In some embodiments, the isolation structure 102 may include a shallow trench isolation (STI) structure 102 embedded in the semiconductor substrate 104. For example, the STI structure 102 may be formed by etching a shallow trench in the semiconductor substrate 104, then filling the trench with dielectric material such as for example silicon oxide, polysilicon, or other appropriate materials. However, the present disclosure is not limited to the shallow trench isolation structure, as other isolation structures such as for example local oxidation of silicon (LOCOS) may be employed in the present disclosure.

In operation 14 of FIG. 1, at least a gate structure 110 is formed on the isolation structure 102, as illustrated in FIG. 3. In various embodiments, the gate structure 110 extends from one of the device regions 104D to the isolation structure 102. In specifics, the gate structure 110 includes a first portion 110a and a second portion 110b. The first portion 110a is located on the isolation structure 102, and the second portion 110b extends to one of the device regions 104D from the first portion 110a.

In some embodiments, the operation 14 of forming the gate structure 110 includes the following acts: (i) forming a gate stack 120 including a high-k dielectric 122 and a polycrystalline silicon 124 over the high-k dielectric 122; and (ii) forming a spacer 130 on a sidewall of the gate stack 120. The term "high-k dielectric" herein refers to a dielectric material having a dielectric constant of greater than about 3.0. The high-k dielectric 122 may include material such as for example hafnium oxide (HfO2), hafnium silicon oxide (HfSiO), hafnium silicon oxynitride (HfSiON), hafnium tantalum oxide (HfTaO), hafnium titanium oxide (HMO), hafnium zirconium oxide (HfZrO), composites thereof, combinations thereof, or other suitable high-k dielectric materials. In some embodiments, the gate stack 120 further includes a protective layer 126 interposed between the high-k dielectric 122 and the polycrystalline silicon 124. The protective layer 126 may be formed of material such as for example titanium nitride (TiN), tantalum nitride (TaN), tungsten nitride (WN), or the like, or other suitable metal compounds. In yet some embodiments, the gate stack 120 further includes a hard mask 128 formed on a top surface of the polycrystalline silicon 124. The hard mask 128 may be formed of material such as for example silicon oxide or the like. In yet some embodiments, the spacer 130 includes a seal 132 and a main spacer wall 134, in which the seal 132 is situated between the main spacer wall 134 and the sidewall of the gate stack 120. The seal 132 and main spacer wall 134 may be formed of material such as for example silicon nitride, silicon oxynitride or the like. In yet some embodiments, the spacer 130 may further include a buffer silicon oxide layer (not shown) interposed between the main spacer wall 134 and the seal 132.

The act (i) of forming the gate stack 120 may be implemented by the steps described below, according to some examples of the present disclosure. In specifics, a layer of high-k dielectric material, a layer of protective material (e.g. TiN, TaN or WN) and a layer of polycrystalline silicon are blanketly deposited in sequence on the semiconductor substrate 104. Thereafter, the hard mask 128 with a pattern is formed over the polycrystalline silicon layer. An etching process is then carried out to pattern the deposited layers of high-k dielectric material, protective material and polycrystalline silicon by using the hard mask 128 as a shielding mask so as to form the gate stack 120.

The act (ii) of forming the spacer 130 may be implemented by the steps described below, according to some examples of the present disclosure. Particularly, a layer of sealing material, a layer of buffer oxide and a layer of main spacer material are blanketly deposited in sequence over both the gate stack 120 and the semiconductor substrate 104. Subsequently, an anisotropic dry-etching process is performed on the deposited layers of the sealing material, buffer oxide and main spacer material to remove the deposited layers from horizontal surfaces, and thereby forming the spacer 130 on the sidewall of the gate stack 120. In some examples, the seal 132 has a thickness of about 0.5 nm to about 30 nm, specifically about 1 nm to about 20 nm, more specifically about 3 nm to about 9 nm. In yet some examples, the main spacer wall 134 has a thickness of about 5 nm to about 60 nm, specifically about 10 nm to about 40 nm, more specifically about 16 nm to about 28 nm.

In operation 16 of FIG. 1, a resist protective oxide (RPO) layer 140' is formed overlaying the gate structure 110 and the isolation structure 102, as illustrated in FIG. 3. The resist protective oxide layer 140' is formed of material capable of preventing silicidation in subsequent processes. In some embodiments, the resist protective oxide layer 140' may be a single layer of silicon oxide, for example. However, in yet some embodiments, the resist protective oxide layer 140' may be a multiple-layered structure. In some examples, the operation 16 of forming the resist protective oxide layer 140' includes an act of depositing a silicon oxide layer overlaying both the gate structure 110 and the isolation structure 102; and an act of depositing a silicon oxinitride (SiON) layer on and in contact with the silicon oxide layer. Specifically, a silicon oxide layer may be deposited, for example, by plasma enhanced chemical vapor deposition (PECVD) over both the gate structure 110 and the isolation structure 102 to a thickness of about 0.5 nm to about 20 nm, specifically about 1 nm to about 10 nm, more specifically about 2 nm to about 6 nm. Thereafter, a silicon oxinitride (SiON) layer is deposited over the silicon oxide layer to a thickness of about 1 nm to about 50 nm, specifically about 2 nm to about 20 nm, more specifically about 6 nm to about 13 nm. In some embodiments, the thickness of the resist protective oxide layer 140' may be about 5 nm to about 50 nm, specifically about 5 nm to about 30 nm, and more specifically approximately 8-13 nm or approximately 14-25 nm.

In operation 18, the resist protective oxide layer 140' is patterned to form a patterned resist protective oxide 140. FIGS. 4-7 schematically depict cross-sectional views at various fabrication stages in the operation 18 according to some embodiments of the present disclosure. It should be noted that the fabrication stages as well as the features in connection with FIGS. 4-7 are merely examples. A person skilled in the art will recognize there may be many alternatives, variations and modifications.

Figure 4:
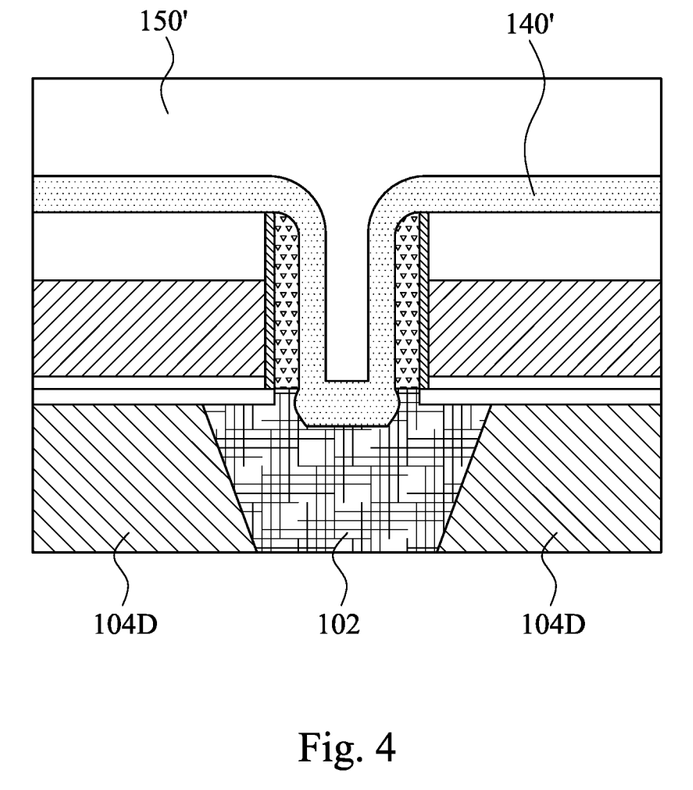
Figure 5:
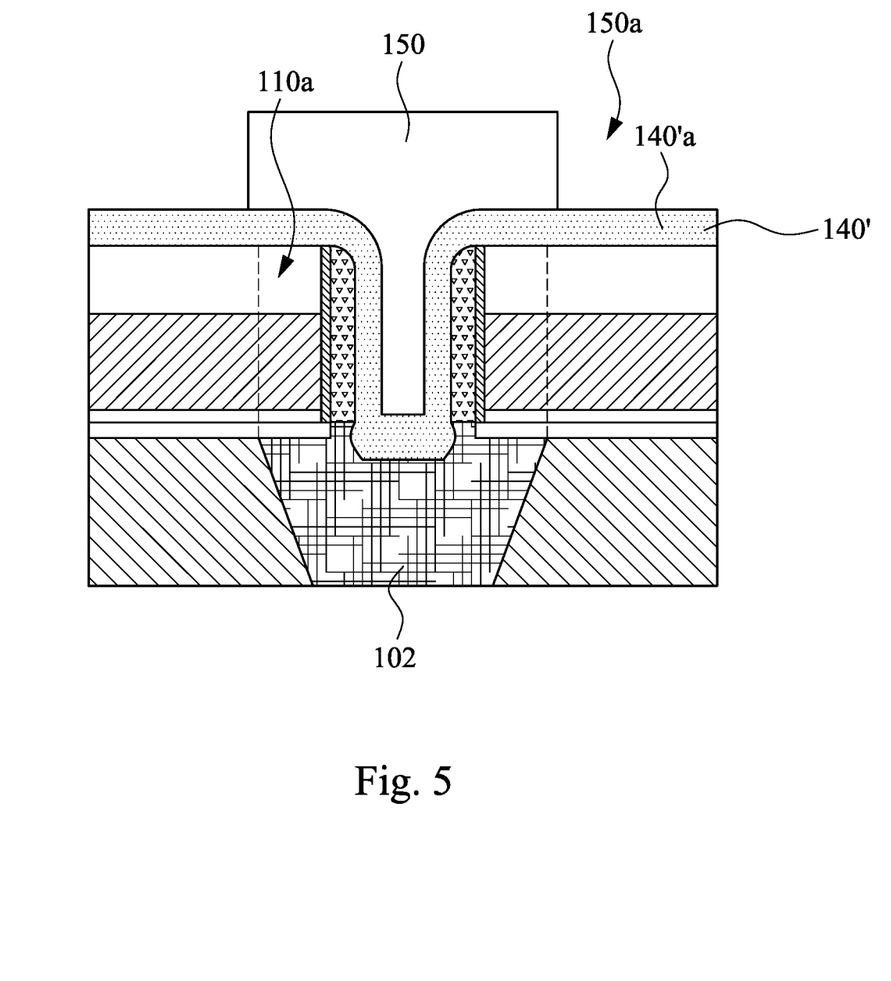

Referring to FIG. 4, a layer 150' of masking material, such as for example photoresist or the like, is formed overlaying the resist protective oxide layer 140' through any appropriate approach such as spin coating. Layer 150' is then patterned to form a masking layer 150 having at least an opening 150a exposing a portion 140'a of the resist protective oxide layer 140', as illustrated in FIG. 5. The masking layer 150 is overlapped with the first portion 110a of the gate structure 110 and at least a portion of the isolation structure 102. In some embodiments, most of layer 150' is removed in the patterning process such that approximately 85-98% of the resist protective oxide layer 140' is exposed out. In yet some embodiments, the masking layer 150 covers the entire isolation structure 102.

Figure 6:
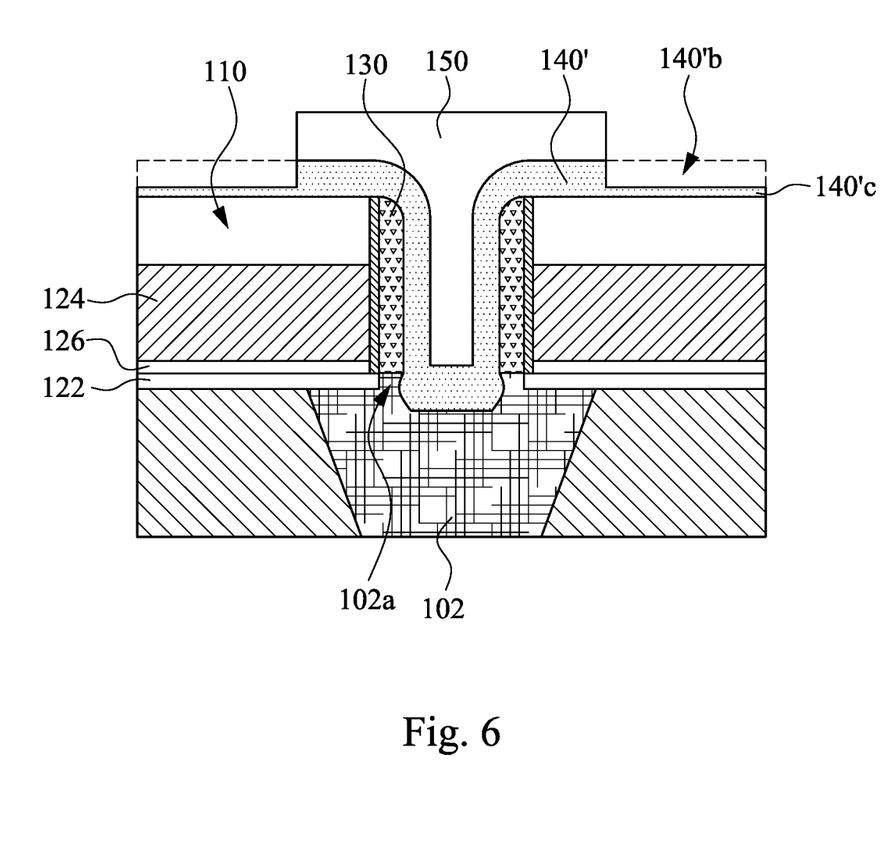
Figure 7:
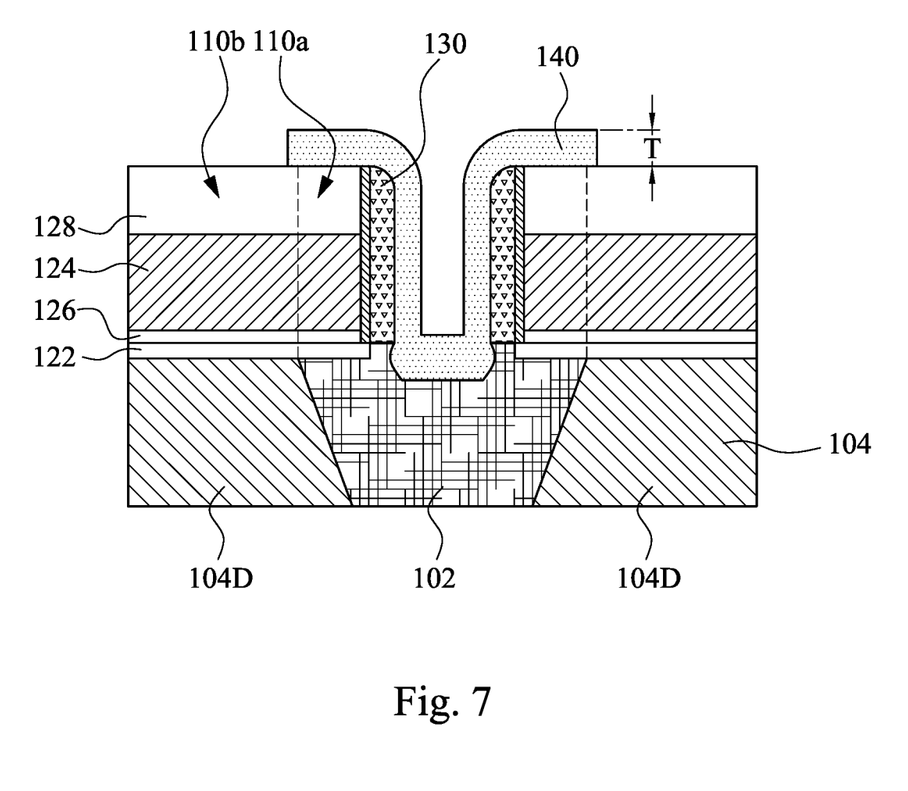

Thereafter, the exposed portion 140'a of the resist protective oxide layer 140' is etched to be a patterned resist protective oxide 140, as illustrated in FIGS. 6 and 7. In some embodiments, a dry etching process is performed to etch away at least a top part 140'b of the exposed portion of the resist protective oxide layer 140', as shown in FIG. 6. Subsequently, a wet etching process is performed to etch away a reminded part 140'c of the exposed portion of the resist protective oxide layer 140', and thereby forming the patterned resist protective oxide 140 shown in FIG. 7.

Referring back to FIG. 6, it is noted that both the masking layer 150 and the resist protective oxide layer 140' cover the spacer 130 and a portion 102a of the isolation structure 102 adjoining the spacer 130 in the wet etching process. Therefore, the etchant used in wet the etching process is restrained from reaching the high-k dielectric 122 through the portion 102a of the isolation structure 102 and/or the interface between the spacer 130 and the isolation structure 102. In a comparative example, the spacer 130 and the portion 102a of the isolation structure 102 were not covered by the masking layer 150 and were exposed in the wet etching process. After the wet etching process was completed, portions of the high-k dielectric 122 undesirably disappeared, and that impacts the product yield and the reliability of the semiconductor devices. It is believed that the etchant used in the wet etching process not only etches away the resist protective oxide layer 140' but also reaches the high-k dielectric 122 through the portion 102a of the isolation structure 102 and/or the interface between the spacer 130 and the isolation structure 102. Therefore, in various embodiments of the present disclosure, the masking layer 150 and the resist protective oxide layer 140' cover the spacer 130 and the portion 102a of the isolation structure 102 in etching processes. Accordingly, the high-k dielectric 122 is well protected, and therefore the product yield and the reliability of the semiconductor devices are improved. In some embodiments, the patterned resist protective oxide 140 has a thickness T (shown in FIG. 7) of about 5 nm to about 50 nm, specifically about 5 nm to about 30 nm, and more specifically approximately 8-13 nm or approximately 14-25 nm.

After the formation of the patterned resist protective oxide 140, the masking layer 150 may be optionally removed from the patterned resist protective oxide 140.

Figure 8:
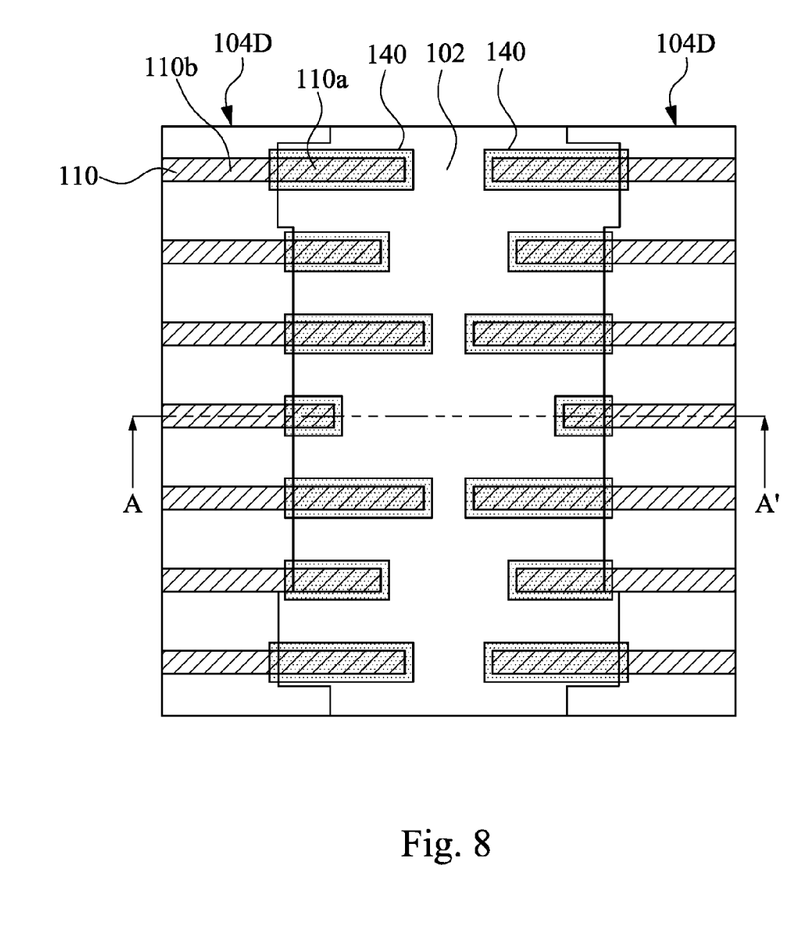
FIG. 8 is a top view schematically illustrating a semiconductor structure according to some embodiments of the present disclosure.

In some embodiments, the patterned resist protective oxide 140 covers the entire first portion 110a of the gate structure 110 on the isolation structure 102, as illustrated in FIG. 7. In yet some embodiments, the patterned resist protective oxide 140 covers the entire the isolation structure 102, as illustrated in FIG. 2 and FIG. 7. In yet some embodiments, as illustrated in FIG. 8, the patterned resist protective oxide 140 may only cover a portion of the isolation structure 102, but still covers the entire first portion 110a of the gate structure 110, in which another portion of the isolation structure 102 is exposed out of the patterned resist protective oxide 140. The patterned resist protective oxide 140 depicted in FIG. 8 merely covers the portion of the isolation structure 102 adjacent to the gate structure 110, but covers the entire first portion 110a of the gate structure 110 within the isolation region. In yet some embodiments, a part of the second portion 110b of the gate structure 110 within the device regions 104D is free from the patterned resist protective oxide 140, as shown in FIG. 2 and FIG. 8. In some examples, the thickness of the patterned resist protective oxide layer 140 may be about 5 nm to about 50 nm, specifically about 5 nm to about 30 nm, and more specifically approximately 8-13 nm or approximately 14-25 nm.

Figure 9:
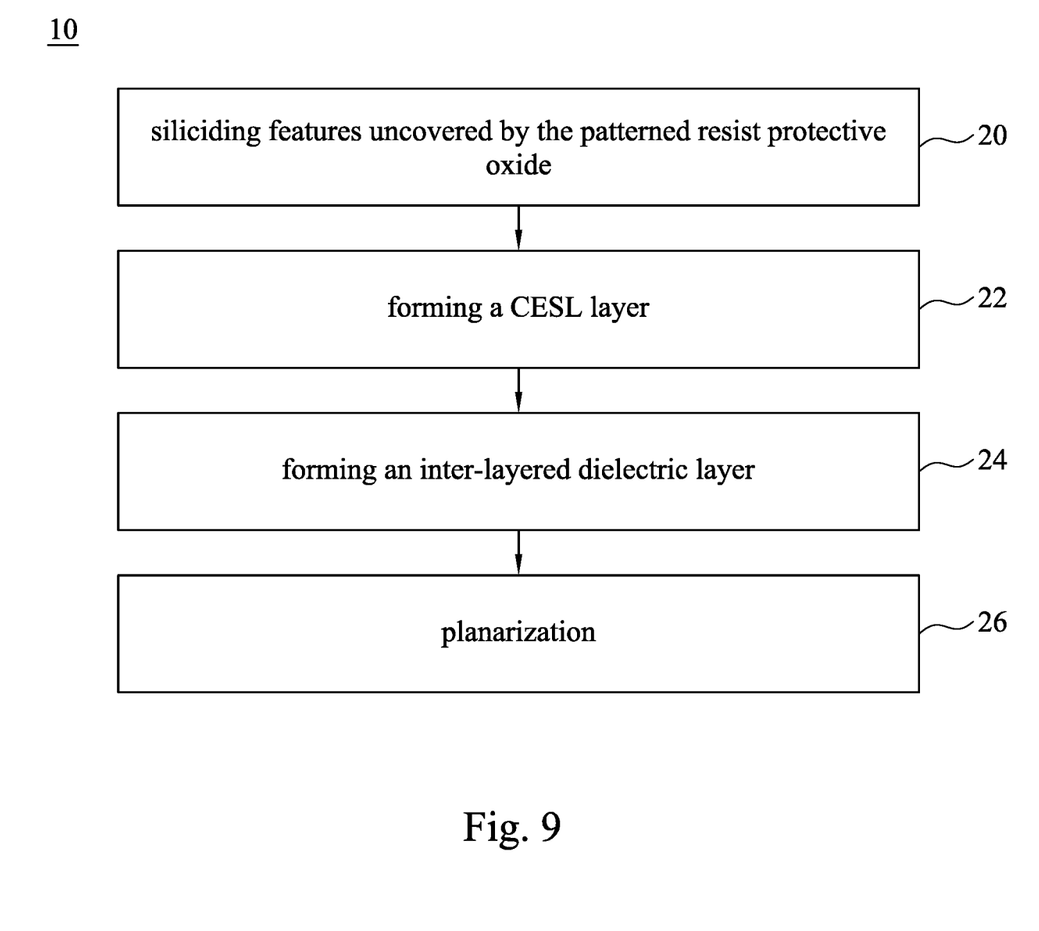
FIG. 9 illustrates several operations that may be performed after operation 18 in FIG. 1 according to some embodiments of the present disclosure.
Figure 10:
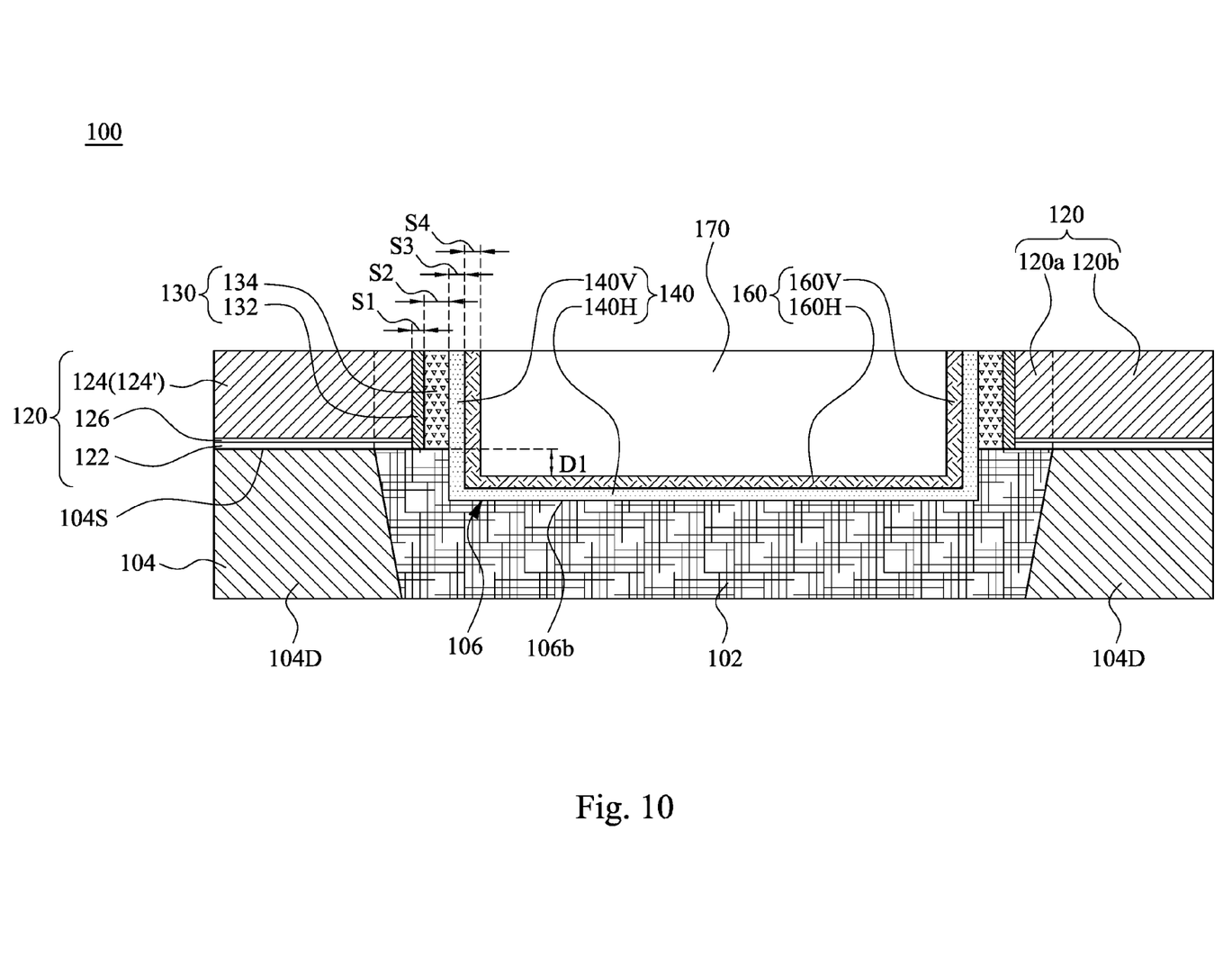
FIG. 10 is a cross-sectional view schematically illustrating a semiconductor structure according to various embodiment of the present disclosure.

According to various embodiments of the present disclosure, the method 10 may optionally include other operations or acts after the operation 18 of FIG. 1. FIG. 9 illustrates several operations 20, 22, 24 and 26 that may be performed after the operation 18 in a flowchart format according to some embodiments of the present disclosure. FIG. 10 is a cross-sectional view schematically illustrating a semiconductor structure 100 after the operations 20, 22, 24 and 26 are carried out according to various embodiments of the present disclosure. For clarity of discussion, the dimensions of the some features depicted in FIG. 10 are increased or reduced, as compared to FIG. 7. For example, the isolation structure 102 in FIG. 10 is laterally enlarged. The detailed description hereinafter in connection with operations 20-26 is best understood when read with FIGS. 7, 9 and 10.

In operation 20 of FIG. 9, structures or features (e.g. source/drain) exposing out of the patterned resist protective oxide (RPO) 140 may be silicided after the formation of the patterned RPO 140. For example, a metal layer may be deposited over the semiconductor substrate 104, and then the metal layer overlaying silicon surfaces is transformed to metal silicide by an annealing treatment. The metal forming the silicide may be a transition metal or metal compound such as for example titanium, cobalt, tungsten, nickel, tantalum, or the like or other appropriate materials. The metal layer may be deposited by chemical vapor deposition, physical vapor deposition, or other alternatives. Any unreacted metal is subsequently removed, and leaving metal silicide on the semiconductor substrate 104.

In operation 22, a contact etching stop layer (CESL) 160 is deposited overlaying the gate structure 110 and the isolation structure 102 on the semiconductor substrate 104.

In operation 24, an inter-layer dielectric (ILD) layer 170 may be deposited over the CESL 160. In operation 26, a planarization process, such as for example a chemical-mechanical polishing (CMP) process, is performed to remove the materials such as CESL, ILD and RPO over the hard mask 128. In some embodiments, the hard mask 128 (shown in FIG. 7) is further removed so that the polycrystalline silicon 124 is exposed, thereby obtaining the semiconductor structure 100 depicted in FIG. 10. In some examples, the CESL 160 may include silicon nitride, silicon oxide or SiON, or the like. In yet some examples, the ILD layer 170 may be formed of a low dielectric constant (low-k) dielectric material, such as phosphosilicate glass (PSG), borophosphosilicate glass (BPSG), fluorinated silicate glass (FSG), silicon carbon material, composites thereof, combinations thereof, or the like, by any suitable approached, such as spinning coating, chemical vapor deposition (CVD), and/or plasma-enhanced CVD (PECVD).

After the operation 26, the method may optionally include an operation of converting the polycrystalline silicon 124 to a metal gate 124' (shown in FIG. 10) according to some embodiments of the present disclosure. For example, the polycrystalline silicon 124 may be etched away while the protective layer 126 serves as an etching stop layer to protect the high-k dielectric 122 there under. Thereafter, the metal gate 124' is formed by deposition, lithography and etching processes and followed by a CMP operation, therefore obtaining the semiconductor structure 100 with the metal gate 124' depicted in FIG. 10. Structures and/or layers typically used in semiconductor devices may be formed over the semiconductor structure 100 in FIG. 10. For example, another inter-layer dielectric layer (not shown) may be formed on the gate 124' and the ILD layer 170, and further via contacts may be formed to connect with the gate, source and/or drain.

According to another aspect of the present disclosure, a semiconductor structure such as for example the semiconductor structure 100 is provided. The semiconductor structure 100 includes a semiconductor substrate 104, an isolation structure 102, a gate stack 120, a spacer 130 and a patterned resist protective oxide 140, as shown in FIG. 10.

The semiconductor substrate 104 has a principal surface 104S on which devices or features are formed. Specifically, the semiconductor substrate 104 may include a plurality of device regions 104D on which active device such as for example N-type metal-oxide semiconductor (NMOS) and/or P-type metal-oxide semiconductor (PMOS) devices are formed. The semiconductor substrate 104 may include, for example, bulk silicon, doped or undoped, or an active layer of a semiconductor-on-insulator (SOI) substrate. Other substrates such as a multi-layered or gradient substrate may also be used.

The isolation structure 102 is formed in the semiconductor substrate 104 so to electrically isolate two adjacent device regions 104D. In some embodiments, the isolation structure 102 may include a shallow trench isolation (STI) structure 102 embedded in the semiconductor substrate 104. However, the present disclosure is not limited to the shallow trench isolation structure, as other isolation structures such as for example local oxidation of silicon (LOCOS) may be used in the present disclosure.

The isolation structure 102 may include a recess 106 positioned on a top portion of the isolation structure 102 according to some embodiments of the present disclosure. In some embodiments, the recess 106 has a bottom surface 106b extending on a level below the principal surface 104S of the semiconductor substrate 104. For example, a vertical distance between the bottom surface 106b and the principal surface 104S may be approximately 12-160 nm, specifically approximately 16-108 nm, and more specifically approximately 29-55 nm.

The gate stack 120 extends from one of the device regions 104D to the isolation structure 102 so that at least a portion of the gate stack 120 is located on the isolation structure 102. In some embodiments, the gate stack 120 includes a first portion 120a and a second portion 120b. The first portion 120a is disposed on and in contact with the isolation structure 102, while the second portion 120b extends to one of the device regions 104D from the first portion 120a. In yet some embodiments, the gate stack 120 includes a gate 124', a high-k dielectric 122 and a protective layer 126 interposed between the gate 124' and the high-k dielectric 122. In examples, the gate 124' may include polycrystalline silicon or metal such as for example Cu, Al, Ni, Ag, Au, Nd, or the like or a combination thereof. The high-k dielectric 122, for example, may include hafnium oxide (HfO2), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), composites thereof, combinations thereof, or other suitable high-k dielectric materials. Further, the protective layer 126 may be formed of material such as for example titanium nitride (TiN), tantalum nitride (TaN), tungsten nitride (WN), or the like, or other suitable materials.

The spacer 130 is disposed along a sidewall of the gate stack 120. In some embodiments, the spacer 130 includes a main spacer wall 134 and a seal 132 interposed between the main spacer wall 134 and the sidewall of the gate stack 120. The seal 132 and main spacer wall 134 may be formed of material such as for example silicon nitride or the like. In yet some embodiments, the spacer 130 may further include a buffer oxide layer (not shown) interposed between the main spacer wall 134 and the seal 132. In some examples, the seal 132 has a thickness S1 of about 0.5 nm to about 30 nm, specifically about 1 nm to about 20 nm, and more specifically about 3 nm to about 9 nm. In yet some examples, the main spacer wall 134 has a thickness S2 of about 5 nm to about 60 nm, specifically about 10 nm to about 40 nm, and more specifically about 16 nm to about 28 nm.

The patterned resist protective oxide 140 is located on the isolation structure 102 and covers a sidewall of the spacer 130 such that the spacer 130 is interposed between the patterned resist protective oxide 140 and the gate stack 120. In some embodiments, the patterned resist protective oxide 140 includes a horizontal portion 140H and a vertical portion 140V. The horizontal portion 140H is disposed on and in contact with the bottom surface 106b of the recess 106, whereas the vertical portion 140V extends upwards from an end of the horizontal portion 140H to the sidewall of the spacer 130. In some examples, the patterned resist protective oxide 140 has a thickness S3 of about 5 nm to about 50 nm, specifically about 5 nm to about 30 nm, and more specifically about 8-13 nm or about 14-25 nm. In yet some embodiments, the patterned resist protective oxide 140 may be a single layer of silicon oxide, or a composite oxide layer including a silicon oxide layer and a silicon oxinitride (SiON) layer.

In yet some embodiments, the semiconductor structure 100 may further include a contact etching stop layer 160 disposed on the patterned resist protective oxide 140. Particularly, the contact etching stop layer 160 has a horizontal part 160H and a vertical part 160V respectively in contact with the horizontal portion 140H and the vertical portion 140V of the patterned resist protective oxide 140. In some examples, the horizontal part 160H of the contact etching stop layer 160 extends on a level below the principal surface 104S of the semiconductor substrate 104. For example, the distance D1 between the principal surface 104S and the top surface of the horizontal part 160H may be about 2 nm to about 50 nm, specifically about 3 nm to about 30 nm, and more specifically about 5 nm to about 18 nm. In yet some examples, the contact etching stop layer 160 has a thickness S4 of about 5 nm to about 60 nm, specifically about 8 nm to about 48 nm, and more specifically about 16 nm to about 24 nm. In yet some examples, the contact etching stop layer 160 may be formed of material such as for example silicon nitride, silicon oxide, SiON or the like.

In yet some embodiments, the semiconductor structure 100 may further include an inter-layer dielectric (ILD) layer 170 on the contact etching stop layer 160 and filled in the recess 106 of the isolation structure 102. The ILD layer 170 may be formed, for example, of a low dielectric constant (low-k) dielectric material, such as phosphosilicate glass (PSG), borophosphosilicate glass (BPSG), fluorinated silicate glass (FSG), silicon carbon material, composites thereof, combinations thereof, or the like.

Advantages of various embodiments of the present disclosure include providing a novel semiconductor structure with RPO on the isolation structure which provides excellent product yield and reliability, and a novel method of manufacturing the semiconductor structure. Furthermore, the method disclosed herein is compatible to existent processes and therefore is cost effective because no additional process is introduced.

In accordance with one aspect of some embodiments, a method of forming a semiconductor structure includes the following operations: (i) forming an isolation structure in a semiconductor substrate, the isolation structure electrically isolating device regions of the semiconductor substrate; (ii) forming a gate structure on the isolation structure; (iii) forming a resist protective oxide layer overlaying the gate structure and the isolation structure; and (iv) patterning the resist protective oxide layer to form a patterned resist protective oxide that covers at least a portion of the isolation structure and a portion of the gate structure on the isolation structure.

In accordance with another aspect of some embodiments, a semiconductor structure includes a semiconductor substrate, an isolation structure, a gate stack, a spacer and a patterned resist protective oxide. The isolation structure is formed in the semiconductor substrate, and electrically isolates device regions of the semiconductor substrate. The gate stack is located on the isolation structure. The spacer is formed along a sidewall of the gate stack on the isolation structure. The patterned resist protective oxide is located on the isolation structure and covers a sidewall of the spacer such that the spacer is interposed between the patterned resist protective oxide and the gate stack.

In accordance with another aspect of some embodiments, a semiconductor structure includes a semiconductor substrate, a shallow trench isolation structure, a gate stack, a spacer, a patterned resist protective oxide, and a contact etching stop layer. The shallow trench isolation structure is formed in the semiconductor substrate and electrically isolates device regions of the semiconductor substrate. The gate stack is located on and in contact with the isolation structure. The spacer is formed along a sidewall of the gate stack. The patterned resist protective oxide is located on the isolation structure and covers a sidewall of the spacer such that the spacer is interposed between the patterned resist protective oxide and the gate stack. The patterned resist protective oxide includes a horizontal portion in contact with the shallow trench isolation structure, and a vertical portion extending from the horizontal portion to the sidewall of the spacer. The contact etching stop layer is disposed on the patterned resist protective oxide. The contact etching stop layer has a horizontal part and a vertical part respectively in contact with the horizontal portion and the vertical portion of the patterned resist protective oxide. The patterned resist protective oxide includes oxide and has a thickness ranged from about 5 nm to about 50 nm.

What is claimed is:

1. A method of forming a semiconductor structure, comprising:
   forming an isolation structure in a semiconductor substrate, the isolation structure electrically isolating device regions of the semiconductor substrate;
   forming a gate structure extending from one of the device regions to the isolation structure, wherein the gate structure has a first portion located on the isolation structure and a second portion extending from the first portion into one of the device regions;
   forming a resist protective oxide layer overlaying the gate structure and the isolation structure; and
   patterning the resist protective oxide layer to form a patterned resist protective oxide that covers at least a portion of the isolation structure and a portion of the gate structure on the isolation structure.

2. The method according to claim 1, wherein the isolation structure comprises a shallow trench isolation structure.

3. The method according to claim 1, wherein the patterned resist protective oxide covers the first portion of the gate structure, and the second portion of the gate structure is free from the patterned resist protective oxide.

4. The method according to claim 1, wherein forming the gate structure comprises:
   forming a gate stack comprising a high-k dielectric and a polycrystalline silicon over the high-k dielectric; and
   forming a spacer on a sidewall of the gate stack.

5. The method according to claim 1, wherein forming the resist protective oxide layer comprises:
   depositing a silicon oxide layer overlaying the gate structure and the isolation structure; and
   depositing a silicon oxinitride layer on and in contact with the silicon oxide layer.

6. The method according to claim 1, wherein patterning the resist protective oxide layer comprises:
   forming a masking layer on the resist protective oxide layer, wherein the masking layer has an opening exposing a portion of the resist protective oxide layer, and the masking layer is overlapped with both the portion of the isolation structure and the portion of the gate structure; and
   removing the exposed portion of the resist protective oxide layer to form the patterned resist protective oxide.

7. The method according to claim 6, wherein removing the exposed portion of the resist protective oxide layer comprises:
   dry etching away a top part of the exposed portion of the resist protective oxide layer; and
   wet etching away a remaining part of the exposed portion of the resist protective oxide layer.

8. The method according to claim 1, wherein the patterned resist protective oxide has a thickness of about 5 nm to about 30 nm.

9. The method according to claim 1, further comprising:
forming a contact etching stop layer over the patterned resist protective oxide.

10. A method of forming a semiconductor structure, comprising:
forming an isolation structure in a semiconductor substrate, the isolation structure electrically isolating device regions of the semiconductor substrate;
forming a gate structure on the semiconductor substrate, wherein the gate structure comprises a first portion in contact with the isolation structure and a second portion extending from the first portion to at least one of the device regions;
forming a resist protective oxide layer overlaying the gate structure and the isolation structure; and
patterning the resist protective oxide layer to form a patterned resist protective oxide that covers at least a portion of the isolation structure and the first portion of the gate structure on the isolation structure, wherein the patterned resist protective oxide comprises a horizontal portion in contact with the isolation structure, and a vertical portion extending from the horizontal portion to a sidewall of the first portion of the gate structure; and
forming a contact etching stop layer on the patterned resist protective oxide, wherein the contact etching stop layer has a horizontal part and a vertical part respectively in contact with the horizontal portion and the vertical portion of the patterned resist protective oxide.

11. The method according to claim 10, further comprising forming an inter-layer dielectric (ILD) layer over the contact etching stop layer.

12. The method according to claim 10, wherein patterning the resist protective oxide layer comprising exposing the second portion of the gate structure.

13. The method according to claim 10, wherein forming the gate structure comprises:
forming a gate stack comprising a high-k dielectric and a polycrystalline silicon over the high-k dielectric; and
forming a spacer on a sidewall of the gate stack.

14. The method according to claim 10, wherein forming the resist protective oxide layer comprises:
depositing a silicon oxide layer overlaying the gate structure and the isolation structure; and
depositing a silicon oxinitride layer on and in contact with the silicon oxide layer.

15. The method according to claim 10, wherein patterning the resist protective oxide layer comprises:
forming a masking layer on the resist protective oxide layer, wherein the masking layer has an opening exposing a portion of the resist protective oxide layer, and the masking layer is overlapped with both the portion of the isolation structure and the first portion of the gate structure; and
removing the exposed portion of the resist protective oxide layer to form the patterned resist protective oxide.

16. The method according to claim 15, wherein removing the exposed portion of the resist protective oxide layer comprises:
dry etching away a top part of the exposed portion of the resist protective oxide layer; and
wet etching away a remaining part of the exposed portion of the resist protective oxide layer.

17. A method of forming a semiconductor structure, comprising:
receiving a semiconductor substrate comprising a plurality of device regions and an isolation structure electrically isolating the device regions;
forming a gate structure on the semiconductor substrate, wherein the gate structure comprises a first portion in contact with the isolation structure and a second portion extending from the first portion to at least one of the device regions;
forming a resist protective oxide layer covering the gate structure and the isolation structure; and
removing a portion of the resist protective oxide layer to expose the second portion of the gate structure on the at least one of the device regions, wherein a remained portion of the resist protective oxide layer covers a portion of the isolation structure and the entirety of the first portion of the gate structure on the isolation structure.

18. The method according to claim 17, wherein removing the portion of the resist protective oxide layer comprises applying a dry etching and subsequently applying a wet etching.

19. The method according to claim 17, after removing the portion of the resist protective oxide layer, further comprising:
forming a contact etching stop layer on the remaining portion of the resist protective oxide layer.

20. The method according to claim 17, wherein forming the resist protective oxide layer comprises:
depositing a silicon oxide layer overlaying the gate structure and the isolation structure; and
depositing a silicon oxinitride layer on and in contact with the silicon oxide layer.

* * * * *